United States Patent [19]

Saunders et al.

[11] Patent Number: 5,896,049
[45] Date of Patent: Apr. 20, 1999

[54] ELECTRICAL SIGNAL FREQUENCY DETECTOR

[75] Inventors: John M. Saunders, Mequon; Jeffrey C. Nelson, DePere, both of Wis.

[73] Assignee: Kohler Co., Kohler, Wis.

[21] Appl. No.: 08/955,077

[22] Filed: Oct. 21, 1997

[51] Int. Cl.⁶ .............................. H03K 9/06; G01R 23/02
[52] U.S. Cl. ................................ 327/48; 327/39
[58] Field of Search ..................... 327/39, 40, 41, 327/43, 44, 46, 47, 48, 49, 113, 115, 116; 377/47, 44

[56] References Cited

U.S. PATENT DOCUMENTS

| | | | |
|---|---|---|---|
| 3,416,080 | 12/1968 | Wright et al. | 324/77 |
| 3,491,294 | 1/1970 | Little et al. | 324/77 |
| 3,524,131 | 8/1970 | McWaid | 324/77 |
| 3,727,079 | 4/1973 | Garrett | 327/79 |
| 3,745,475 | 7/1973 | Turner | 327/42 |
| 3,859,512 | 1/1975 | Ritzinger | 235/151.3 |
| 4,070,461 | 1/1978 | Thomas | 324/78 D |
| 4,232,267 | 11/1980 | Hanajima et al. | 327/48 |
| 4,305,041 | 12/1981 | Frerking | 327/39 |
| 4,345,169 | 8/1982 | Saleh | 327/72 |
| 5,056,123 | 10/1991 | Rashid | 377/49 |

*Primary Examiner*—My-Trang Nu Ton
*Attorney, Agent, or Firm*—Quarles & Brady

[57] ABSTRACT

A circuit for measuring the frequency of an electrical signal includes a detector that senses a reoccurring phase point the electrical signal. A divide-by-M counter is connected to the detector and produces a control signal upon every Mth occurrence of the indication, where M is a positive number greater than one. A clock signal generator is provided. An output counter counts cycles of the clock signal between occurrences of the control signal and divides the count by M to produce an output count that corresponds to the frequency of the electrical signal.

10 Claims, 4 Drawing Sheets

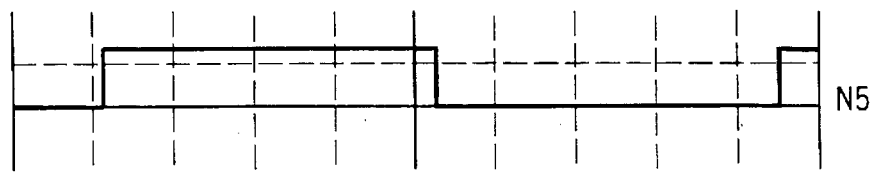
FIG. 2F  N5
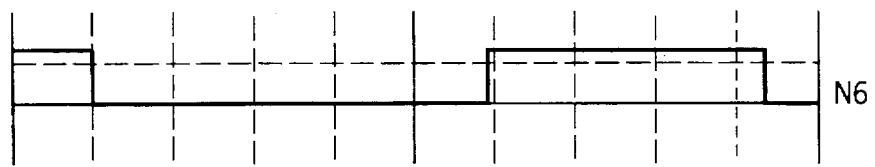
FIG. 2G  N6
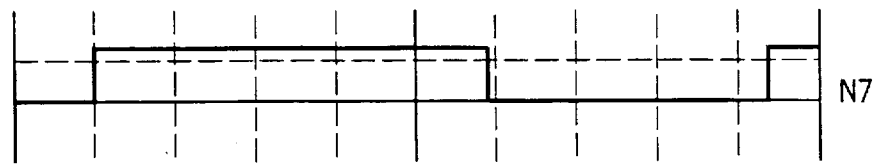
FIG. 2H  N7
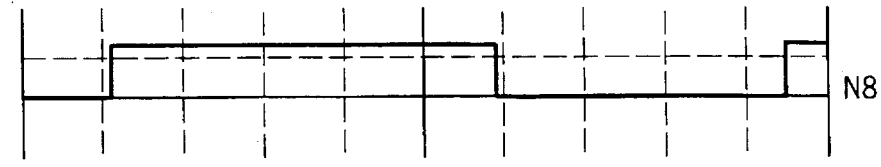
FIG. 2I  N8
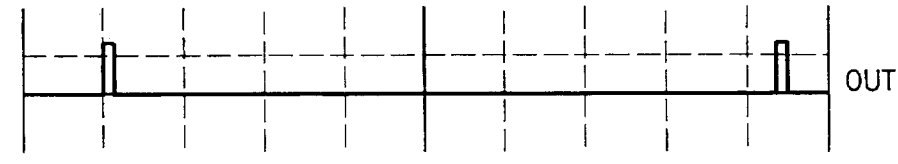
FIG. 2J  OUT

ELECTRICAL SIGNAL FREQUENCY DETECTOR

BACKGROUND OF THE INVENTION

The present invention relates to apparatus which measure the frequency of an electrical signal; and particularly to such apparatus which detect a predefined reoccurring characteristic of the electrical signal.

The frequency of an electrical signal is measured by detecting a given reoccurring characteristic, such as a maximum, minimum or zero crossing point, in the signal waveform. The amount of time the elapses between each occurrence of such a signal characteristic indicates the period of the signal, which parameter corresponds to the frequency.

For example, a sinusoidal signal has two zero crossings per cycle, i.e. one crossing at the beginning of the cycle and another at the mid point of the cycle; of course there is another zero crossing at the end of the cycle when another signal cycle begins. Detecting one zero crossing per cycle can be employed to determine the frequency or the period of the signal.

Circuits have been developed to detect zero crossings of a signal. However, such prior circuits detected every zero crossing and could not distinguish the zero crossing at the beginning of a cycle from the one at the cycle mid point.

SUMMARY OF THE INVENTION

A general object of the present invention is to provide an electrical circuit which indicates frequency by detecting a predefined characteristic which regularly occurs in a periodic signal.

Another object is to provide a detection circuit that is able to distinguish the zero crossing at either the beginning or mid point of a signal cycle from the other zero crossing of the cycle.

A further object of the present invention is to average the time which elapses between several consecutive occurrences of the predefined signal characteristic over several signal cycles to negate effects that sporadic events may have on the frequency determination.

These and other objects are satisfied by a circuit for measuring the frequency of an electrical signal includes a detector that senses a reoccurring phase point the electrical signal. The detector comprises a divide-by-M counter is connected to the detector and produces a control signal upon every Mth occurrence of the indication, where M is a positive number greater than one. A clock signal generator is provided. An output counter counts cycles of the clock signal between occurrences of the control signal and divides the count by M to produce an output count that corresponds to the frequency of the electrical signal.

In the preferred embodiment of the present invention the detector comprises a rectifier stage that produces first and second complementary signals from a periodic input signal. A Schmitt circuit has an input which is coupled to the rectifier stage and produces a first intermediate signal in response to voltage variation of the first complementary signal. A complementary Schmitt circuit has an input connected to the rectifier stage and produces a second intermediate signal in response to the voltage level of the second complementary signal.

The Schmitt circuit is characterized by a voltage hysteresis transfer function which produces one of two discreet output voltages, e.g. circuit ground potential or Vcc, depending upon the relationship of the input voltage to lower and upper thresholds. As the input voltage increases from ground potential, the output voltage remains at ground potential as long as the input voltage is below the upper threshold. When the input voltage exceeds the upper threshold, the output voltage switches to Vcc where it remains until the input voltage falls below the lower threshold at which time the output voltage returns to ground potential.

The complementary Schmitt circuit functions whereby the output voltage remains at ground potential until the increasing input voltage level reaches the lower threshold when the output voltage switches to Vcc. Thereafter, the output voltage remains at Vcc until the input voltage level first exceeds and then decreases below the upper threshold at which occasion the output voltage returns to ground potential.

An output stage is connected to the Schmitt circuit and to the complementary Schmitt circuit to receive the first and second intermediate signals. The output stage responds to the relationship of the first and second intermediate signals by producing an output signal that indicates each occurrence of the reoccurring characteristic in the periodic input signal.

BRIEF DESCRIPTION OF THE DRAWINGS

FIGS. 2A through 2J depict waveforms of signals at selected places in the signal phase detector of FIG. 1.

DETAILED DESCRIPTION OF THE INVENTION

Figure 1:
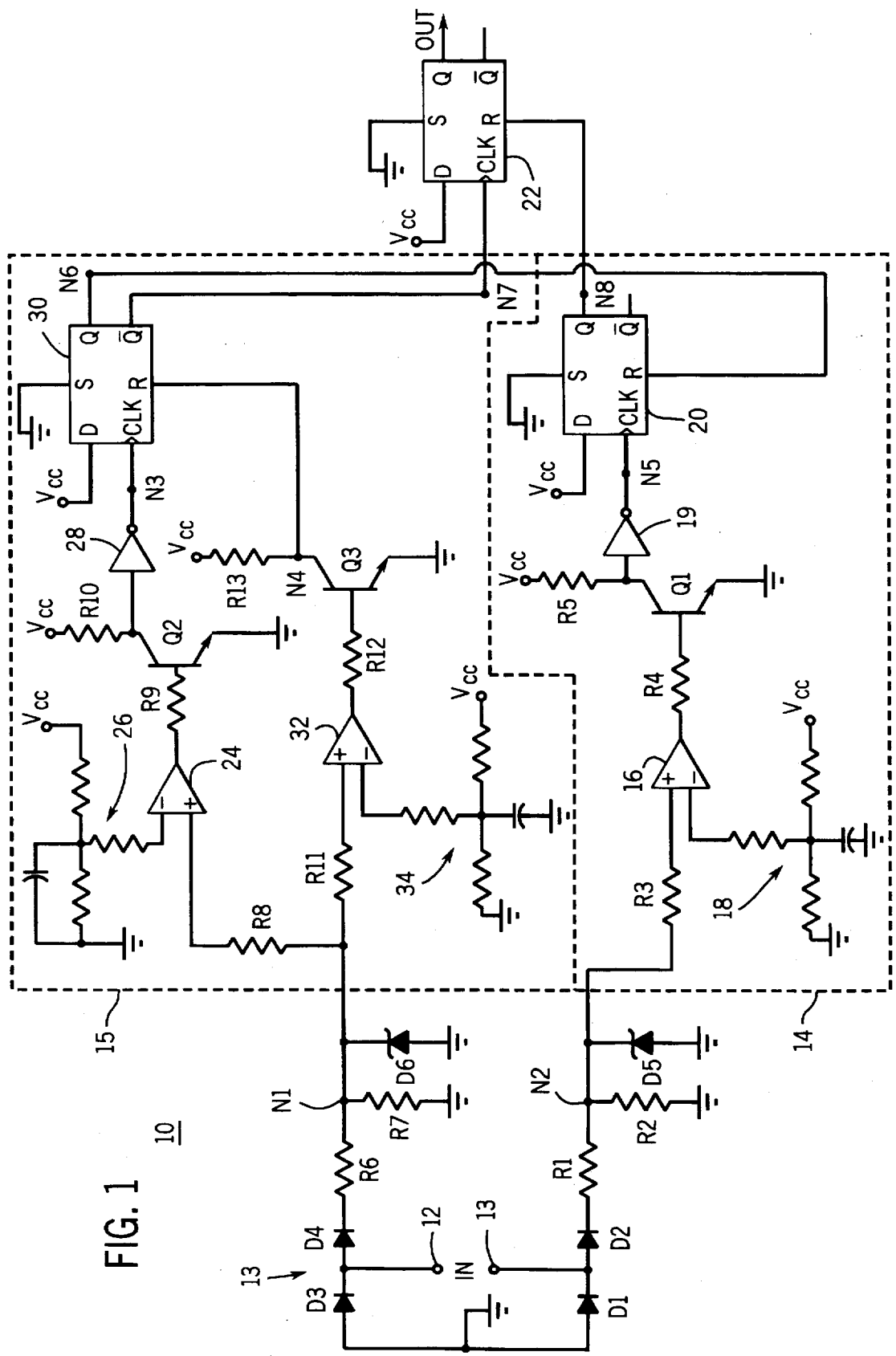
FIG. 1 is a schematic circuit diagram of a signal phase detector according to the present invention.

With initial reference to FIG. 1, a phase detector, generally designated 10, has a pair of input terminals 11 and 12 across which is applied an electrical signal for processing. Although the phase detector is being described in terms of processing a time periodic electrical signal and detecting a reoccurring point, such as a zero crossing, in that signal, phase detector 10 can be used to detect an occurrence of a predefined point in other types of signals.

Terminals 11 and 12 are part of an input stage 13 which includes a pair of half-wave rectifiers formed by diodes D1–D4 that produce complementary DC signals at nodes N1 and N2. The rectified signals are scaled in attenuator circuits comprising resistors R1 and R2 along with Zener diode D5 for one circuit branch, and resistors R6 and R7 in conjunction with Zener diode D6 for the complementary branch. The attenuation produces signal levels which are compatible with the subsequent digital logic of a Schmitt circuit 14 and a complementary Schmitt circuit 15.

The Schmitt circuit 14 receives the signal from node N2 and applies that signal via resistor R3 to the non-inverting input of a first voltage comparator 16. A first reference voltage, produced by voltage divider 18, is applied to the inverting input of the first voltage comparator 16. The output of the first comparator 16 is applied through resistor R4 to the base of an NPN transistor Q1, which has an emitter connected directly to ground and a collector connected by resistor R5 to a source of positive voltage Vcc.

The collector of transistor Q1 also is connected to the input of an inverter 19 having an output at node N5 that is connected to the CLOCK input of a first D-type flip-flop 20. The D input to flip-flop 20 is tied to the positive voltage Vcc and the SET input is clamped to ground. The Q output of flip-flop 20 is directly connected to the RESET input of a second, or output, D-type flip-flop 22.

Returning to the input stage 13 of the phase detector 10, node N1 is connected to the input of the complementary Schmitt circuit 15. Specifically, resistor R8 couples node N1 to the non-inverting input of a second voltage comparator 24 which has an inverting input that receives a second reference voltage from voltage divider 26. The output of the second voltage comparator 24 is coupled by resistor R9 to the base of transistor Q2 which has an emitter connected directly to ground and a collector connected by resistor R10 to positive voltage Vcc. The collector of transistor Q2 also is connected to the input of a second inverter 28 which produces an output that is coupled at node N3 to the clock input of a third D-type flip-flop 30. The D input of the third flip-flop 30 is directly connected to the positive voltage Vcc, while the SET input is tied to ground. The Q output of the third flip-flop 30 is coupled via node N6 to the RESET input of the first flip-flop 20.

The $\overline{Q}$ output of the third flip-flop 30, at node N7, is applied to the clock input of the second flip-flop 22. The D input of the second flip-flop 22 is clamped to positive voltage Vcc and the SET input is tied to ground. The Q terminal of the second flip-flop 22 produces the output signal for the phase detector 10, as will be described.

Referring again to the input of the complementary Schmitt circuit 15, node N1 of the input stage 13 also is coupled by resistor R11 to the non-inverting input of a third voltage comparator 32. Voltage divider 34 produces a third reference voltage is applied to the inverting input of the third voltage comparator 32. The output of the third voltage comparator 32 is coupled through resistor R12 to the base of transistor Q3 which has an emitter tied directly to ground and a collector coupled by resistor R13 to supply voltage Vcc. The collector of transistor Q3 also is connected at node N4 to the RESET input of the third flip-flop 30.

Figure 2A:
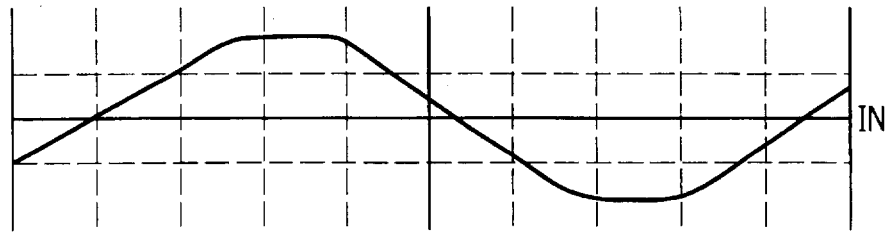
Figure 2B:
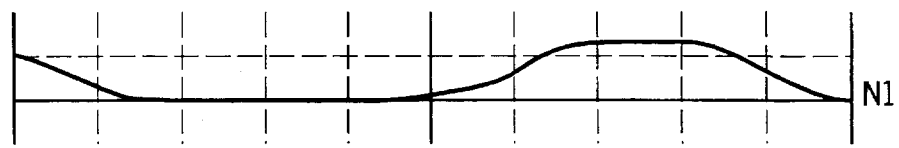
Figure 2C:
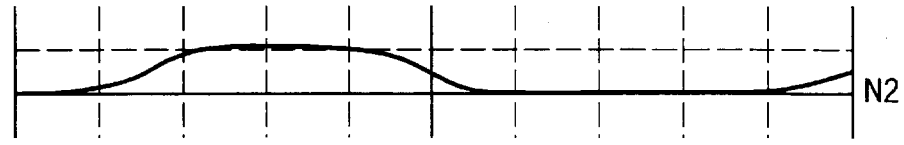

The operation of the phase detector 10 will be described with reference to the circuit diagram in FIG. 1 and the waveform diagrams in FIGS. 2A-2J. Although a sinusoidal input signal is depicted in FIG. 2A, it is understood that the present invention can be utilized with other types of waveforms with a substantially constant first derivative in the region of the zero crossing point. The input signal is applied across terminals 11 and 12 and is partitioned by the pair of half-wave rectifiers, diodes D1-D4, into the two complementary signals at nodes N1 and N2 having the waveforms shown in FIGS. 2B and 2C. The signals at nodes N1 and N2 are applied to complementary Schmitt circuit 15 and the Schmitt circuit 14, respectively.

The Schmitt circuit 14 is characterized by a voltage hysteresis transfer function which produces one of two discreet output voltages, e.g. circuit ground potential or Vcc, depending upon the relationship of the input voltage to lower and upper thresholds. As the input voltage increases from ground potential, the output voltage remains at ground potential as long as the input voltage is below the upper threshold. When the input voltage exceeds the upper threshold, the output voltage switches to Vcc. Thereafter, the output voltage remains at Vcc until the input voltage falls below the lower threshold at which time the output voltage returns to ground potential.

In contrast, the complementary Schmitt circuit 15 operates whereby the output voltage remains at ground potential until the increasing input voltage level reaches the lower threshold when the output voltage switches to Vcc. Thereafter, the output voltage remains at Vcc until the input voltage level first exceeds and then decreases below the upper threshold at which occasion the output voltage returns to ground potential.

The Schmitt circuit 14 receives the signal at node N2 (FIG. 2C) and comparator 16 determines whether that signal exceeds a reference voltage level set by voltage divider 18. When that occurs the comparator 16 produces a high logic level output which turns on transistor Q1. When Q1 is conductive, the input to inverter 19 is grounded producing a high logic level at node N5 (FIG. 2F) which is applied to the clock input of the first flip-flop 20. The comparator 16 and associated output circuits produce the digital equivalent of the rectified input voltage at node N8. That is, the voltage at node N5 is a high logic level during the positive half cycle of the input signal applied across terminals 11 and 12. The rising edge of the waveform at node N5 causes the Q output of the first flip-flop 20 to go high as shown in the waveform for node N8 (FIG. 2I). This output signal from the Schmitt circuit 14 resets the second flip-flop 22 causing the output signal for the phase detector 10 to go to a low logic level, as shown in FIG. 2J.

Figure 2D:
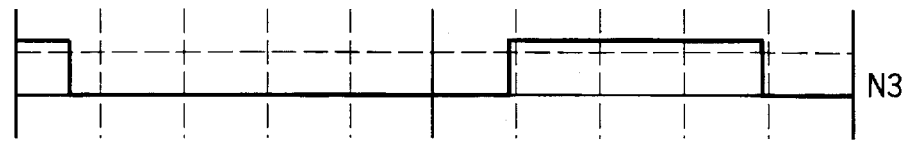

At the same time, the complementary rectified input signal produced at node N1 (FIG. 2B) is applied to the input of the complementary Schmitt circuit 15. That signal is applied to a similar voltage comparator 24 to produce a digital equivalent of the rectified input voltage at node N3, as depicted in FIG. 2D. This digital equivalent is fed to the clock input of the third flip-flop 30. The rising edge of the waveform at node N3 causes the Q output of the third flip-flop 30 (FIG. 2G) to go to a high logic level. The Q output of the third flip-flop 30 at node N6 is connected to the RESET input of the first flip-flop 20 thereby causing the Q output of the first flip-flop at node N8 to go to a low logic level, as shown in FIG. 2I. Simultaneously, the $\overline{Q}$ output of the third flip-flop 30 as shown in the waveform at node N7 (FIG. 2H) goes low.

Figure 2E:
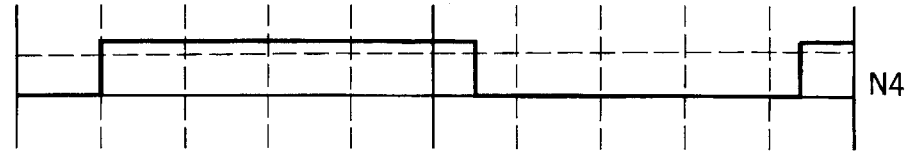

The complementary rectified signal at node N1 (FIG. 2B) also is applied to the third voltage comparator 32 within the complementary Schmitt circuit 15. This comparator 32 receives a reference voltage level from voltage divider that is lower than the reference voltage produced by voltage divider 26 and is applied to the second comparator 24 within complementary Schmitt circuit 15. As a consequence, the output of the third comparator 32 will go high before the output of the second comparator 24. The output of the third comparator 32 is inverted by resistor R13 and transistor Q3 to produce a waveform at node N4 as shown in FIG. 2E. This inverted waveform was applied to the RESET input of the third flip-flop 30. As a consequence, when the signal at node N1 falls below the reference voltage threshold produced by voltage divider 34, the voltage level at node N4 goes high resetting the third flip-flop 30. That action produces a low logic level at the Q output of the third flip-flop 30 (node N6) and a high logic level at the $\overline{Q}$ output (node N7).

In response to the signals from the two Schmitt circuits 14 and 15, the second flip-flop 22 produces a positive pulse at its Q terminal (OUT) upon the occurrence of the zero crossing at the beginning (0° phase) of each cycle of the input signal to the phase detector 10. There is no equivalent pulse at the mid cycle (180° phase) zero crossing of the input signal. Note that the 0° phase zero crossing of the input signal occurs at the center of the output signal pulse, thus the output pulse provides an accurately timed indication of the input signal phase.

By reversing the connection of nodes N1 and N2 to the Schmitt circuit 14 and complementary Schmitt circuit 15, the output pulses of the phase detector 10 will indicate the occurrence of a zero crossing at the 180° point of the input signal cycle. In this version of the phase detector, node N1 is connected to the input of the Schmitt circuit 14 and node N2 is connected to the input of the complementary Schmitt circuit 15. The present phase detector also can be configured to produce the output pulses at the maximum or minimum points of the input signal waveform.

Figure 3:
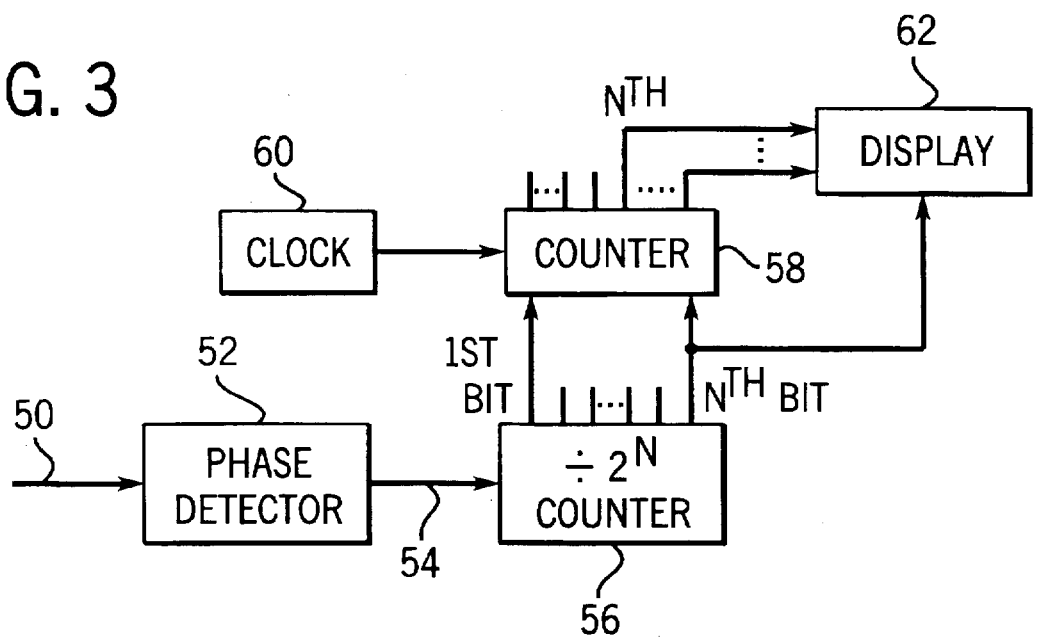
FIG. 3 is a schematic diagram of a circuit which measures the period of a signal by using the present signal phase detector.

FIG. 3 shows the use of the present phase detector to determine the period of a signal. That signal on line 50 is applied to the input terminals of a phase detector 52 of the type shown in FIG. 1. As noted previously, the phase detector 52 produces an output signal on line 54 whenever a predetermined point, such as at zero phase, occurs in the signal. Although one could simply measure the amount of time occurring between two consecutive pulses at the output of the phase detector 52, a more accurate determination of the signal period is produced by measuring the times between a defined number of consecutive output pulses from the phase detector 52 and averaging those times.

To this end, the output line 54 from the phase detector 52 is connected to the input of a first binary counter 56 which determines when the defined number ($2^N$) of signal periods to be averaged have occurred. For example, when 64 signal periods are being averaged, N equals 6. The first binary counter 56 may be a implemented using any of several commercially available integrated circuits. The resultant count of input signal periods is produced by the first counter 56 on a plurality of binary output lines. The output line for the lowest order, or first bit, of the counter output is connected to the start control input of a second binary counter 58, and the output line of the first binary counter 56 for the Nth bit is connected to the stop control input of the second binary counter 58.

The CLOCK input to the second binary counter 58 is connected to the output of a oscillator clock circuit 60 which operates at a relatively high frequency as compared to the frequency of the input signal being measured on line 50. Thus ensures that the second binary counter, which counts the cycles of the CLOCK signal, will have a sufficient resolution to properly measure variations in the period of the input signal. The second binary counter 58 is configured to divide the count of CLOCK signal pulses by the number of input signal periods $2^N$ which are being averaged. Because the number of input signal periods is a power of 2, the averaging is accomplished by ignoring the binary output lines of the second counter 58 which are below the value of $2^N$. That is the lowest order bit for the quotient is the Nth output bit of the second counter 58. The higher order bits (above the Nth bit) form the remaining binary bits of the quotient.

The selected output lines of the second counter 58 are connected as inputs to a display circuit 62. The display circuit 62 also receives the Nth bit from the first binary counter 56 which indicates when $2^N$ periods of the input signal have been received and thus when the output of the second binary counter 58 indicates the average input signal period. In response to the Nth bit from the first binary counter 56, the display circuit 62 converts the binary output from the second counter 58 into the decimal equivalent and applies it to drivers for display elements. Thus the display 62 presents to the user the average period of the input signal in terms of a count of the pulses from the clock circuit 60. By judiciously selecting the frequency of the CLOCK signal, the displayed period may have a known time relationship. For example, a clock frequency of 1 kilohertz would result in an output display in which the numerical value is a count of thousandths of a second which is easily displayed in a decimal format.

One skilled in the art would also appreciate that the circuit in FIG. 4 could also be utilized to determine the frequency of the input signal on line 50 by inverting the period measurement.

We claim:

1. A circuit for measuring a frequency of an electrical signal, said circuit comprising:

a detector for sensing each occurrence of a predefined characteristic of the electrical signal and produces an indication of each such occurrence, wherein the detector comprises:

(a) a rectifier stage which rectifies the electrical signal into first and second complementary signals, (b) a Schmitt circuit having an input connected to the rectifier stage and receiving the first complementary signal, the Schmitt circuit producing a first intermediate signal, (c) a complementary Schmitt circuit having an input connected to the rectifier stage and receiving the second complementary signal, the complementary Schmitt circuit producing a second intermediate signal, and (d) an output stage connected to the Schmitt circuit and the complementary Schmitt circuit, and responding to the first and second intermediate signals by producing an output signal that indicates each occurrence of the point in the waveform of the electrical signal;

a divide-by-M counter connected to the detector and which produces a control signal upon every Mth occurrence of the indication where M is a positive number greater than one;

a generator of a clock signal having regularly occurring cycles;

an output counter connected to the generator and the divide-by-M counter to produce a count of cycles of the clock signal between occurrences of the control signal and divide the count by M to produce an output count that corresponds to the frequency of the electrical signal.

2. The circuit as recited in claim 1 wherein the Schmitt circuit comprises:

a comparator for comparing the first complementary signal to a first reference voltage and having an output at which a voltage level is produced in response thereto; and a flip-flop having a clock input connected to the output of the comparator, and having an output at which the first intermediate signal is produced.

3. The circuit as recited in claim 1 wherein the complementary Schmitt circuit comprises:

a first comparator for comparing the second complementary signal to a first reference voltage and having a first output at which a voltage level is produced in response to the comparing;

a second comparator for comparing the second complementary signal to a second reference voltage and having a second output at which another voltage level is produced in response to comparing the second complementary signal; and a flip-flop having a clock input connected to the first output of the first comparator, a reset input connected to the second output of the second comparator, and a third output at which the second intermediate signal is produced.

4. The circuit as recited in claim 1 wherein the output stage produces the output signal whenever the first and second intermediate signal have opposite logic levels.

5. The circuit as recited in claim 1 wherein the output stage comprises a flip-flop having a reset input connected to the Schmitt circuit to receive the first intermediate signal, a clock input connected to the complementary Schmitt circuit to receive the second intermediate signal, and an output at which the output signal is produced.

6. The circuit as recited in claim 1 wherein the divide-by-M counter comprises a first binary counter having a Nth bit output, where $M=2^N$, on which the control signal is produced.

7. The circuit as recited in claim 6 wherein the output counter comprises a second binary counter having a clock input to which the clock signal is applied and a stop counting input connected to the Nth bit output of the first binary counter, the second binary counter further having a plurality of X binary output lines, where X is a positive number greater than N, with the output count being produced at the Nth through Xth binary output lines.

8. A circuit for measuring a frequency of an electrical signal, said circuit comprising:
- a detector for sensing each occurrence of a predefined characteristic of the electrical signal and produces an indication of each such occurrence;
- a divide-by-M counter connected to the detector and which produces a control signal upon every Mth occurrence of the indication, where M is a positive number greater than one;
- a generator of a clock signal having regularly occurring cycles;
- an output counter connected to the generator and the divide-by-M counter to produce an output count that corresponds to the frequency of the electrical signal, wherein the output count is equal to dividing a count of cycles of the clock signal between occurrences of the control signal by M.

9. The circuit as recited in claim 8 wherein the divide-by-M counter comprises a first binary counter having a Nth bit output on which the control signal is produced, where $M=2^N$.

10. The circuit as recited in claim 9 wherein the output counter comprises a second binary counter having a clock input to which the clock signal is applied and a stop counting input connected to the Nth bit output of the first binary counter, the second binary counter further having a plurality of X binary output lines, where X is a positive number greater than N, with the output count being produced at the Nth through Xth binary output lines.

* * * * *